United States Patent
He et al.

(10) Patent No.: US 10,747,245 B1
(45) Date of Patent: Aug. 18, 2020

(54) APPARATUSES AND METHODS FOR ZQ CALIBRATION

(71) Applicant: MICRON TECHNOLOGY, INC., Boise, ID (US)

(72) Inventors: Yuan He, Boise, ID (US); Yasuo Satoh, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/688,870

(22) Filed: Nov. 19, 2019

(51) Int. Cl.
G05F 1/46 (2006.01)
G11C 7/10 (2006.01)
G11C 5/06 (2006.01)
H03K 19/00 (2006.01)

(52) U.S. Cl.
CPC .............. *G05F 1/463* (2013.01); *G11C 5/063* (2013.01); *G11C 7/1051* (2013.01); *H03K 19/0005* (2013.01)

(58) Field of Classification Search
None
See application file for complete search history.

(56) References Cited

U.S. PATENT DOCUMENTS

| | | | |
|---|---|---|---|
| 6,307,791 B1 * | 10/2001 | Otsuka | G11C 7/1051 326/30 |
| 9,716,497 B2 * | 7/2017 | Cho | H03K 19/0005 |
| 9,786,352 B2 * | 10/2017 | Yoshida | G11C 11/40626 |
| 10,269,395 B2 * | 4/2019 | Arai | G11C 7/1057 |
| 10,361,699 B2 * | 7/2019 | Lee | G11C 29/022 |
| 2019/0362763 A1 * | 11/2019 | Lee | G11C 29/028 |

* cited by examiner

*Primary Examiner* — Jeffery S Zweizig
(74) *Attorney, Agent, or Firm* — Dorsey & Whitney LLP

(57) ABSTRACT

In an example semiconductor device, the voltage/temperature conditions of the semiconductor device and associated calibration codes of multiple instances of ZQ calibrations are pre-stored in a register array. When a pre-stored voltage/temperature condition occurs again, ZQ calibration is not performed. Instead, the associated pre-stored calibration code is retrieved from the register array and provided to the IO circuit. When a voltage/temperature condition of the semiconductor device does not match any pre-stored voltage/temperature condition in the register array, a ZQ calibration is performed. When the ZQ calibration is performed, a register in the register array is selected according to an update policy and updated by the calibration code newly provided by the ZQ calibration along with the voltage/temperature condition at the time when the ZQ calibration is performed.

20 Claims, 9 Drawing Sheets

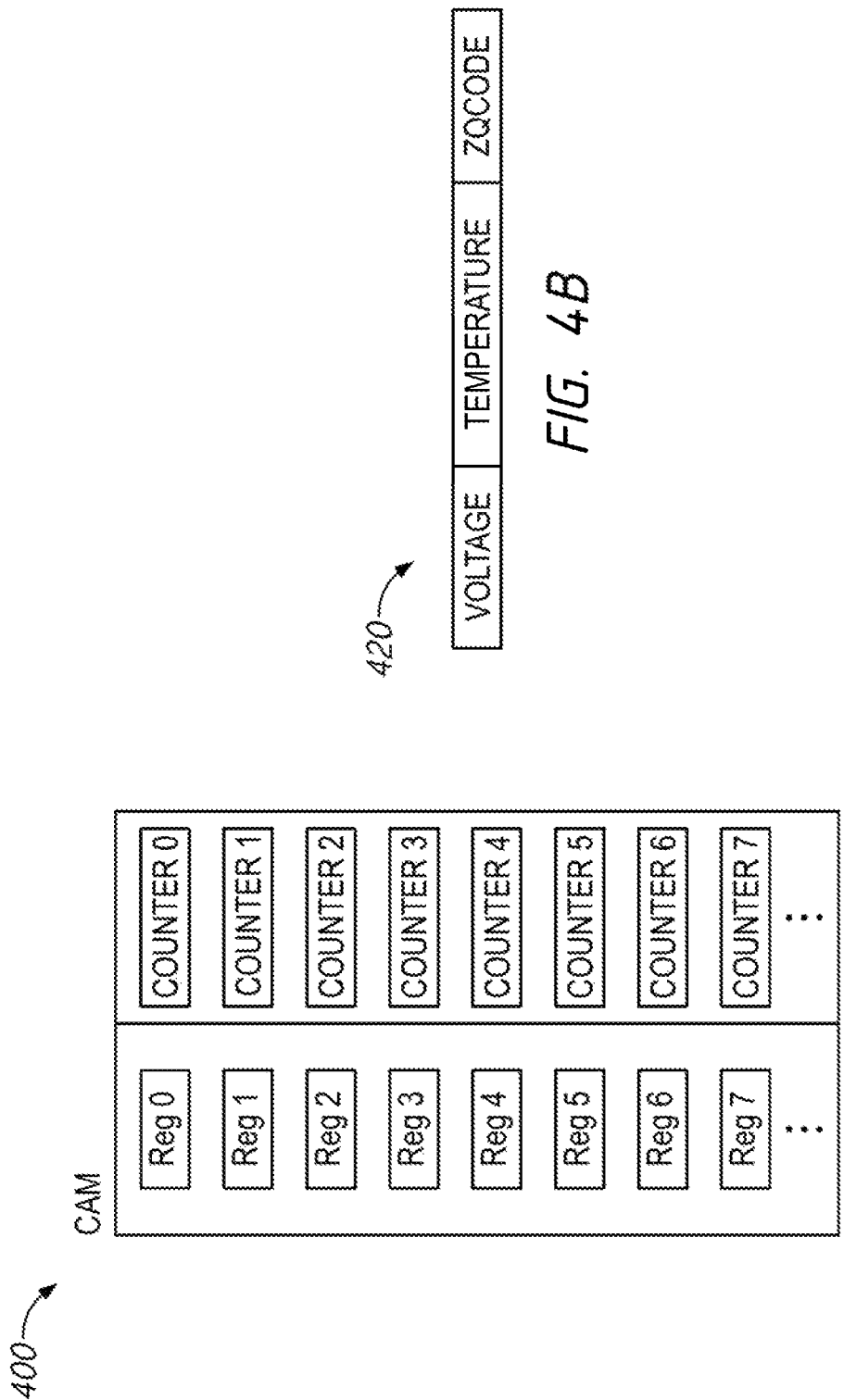

APPARATUSES AND METHODS FOR ZQ CALIBRATION

BACKGROUND

A semiconductor memory device, such as a DRAM (Dynamic Random Access Memory), includes memory cell arrays each having memory cells disposed at intersections between word lines and bit lines. Various conditions in the memory device, such as operating temperatures and voltages in the power supply etc., may affect the performance of the memory device. For example, the impedance of the input/output (IO) circuit may be affected by the varying power supply voltage or temperature. As such, an impedance calibration (e.g., ZQ calibration) is periodically performed in the memory device to compensate for the variations of impedance of the IO circuit. However, when a ZQ calibration is performed, a higher power voltage may be required, and the performance of the semiconductor device may be adversely affected.

BRIEF DESCRIPTION OF THE DRAWINGS

FIGS. 4A and 4B are examples of memory content in a content-addressed memory according to some examples described in the disclosure.

DETAILED DESCRIPTION

In some embodiments of the disclosure, in a semiconductor device, such as a memory device, an impedance calibration command (e.g., a ZQ calibration command) is periodically provided to a ZQ calibration circuit to perform an impedance calibration operation (e.g., a ZQ calibration operation). Periodically performing the calibration operation may compensate for variations of impedance of the IO circuit due to voltage and/or temperature changes in the semiconductor device. The semiconductor device may pre-store multiple calibration codes from previous ZQ calibrations or initial back-end testing in a register array along with associated voltage variations or temperatures values. When a ZQ calibration signal is received, the semiconductor device may compare a current voltage/temperature condition of the device with the pre-stored voltage/temperature conditions in the register array. When the current voltage/temperature condition and a pre-stored voltage/temperature condition in the register array match, the semiconductor device may skip the ZQ calibration by applying a pre-stored calibration code associated with the matching pre-stored voltage/temperature condition to the IO circuit. Conversely, when the current voltage/temperature condition does not match any pre-stored voltage/temperature condition in the register array, the semiconductor device may perform the ZQ calibration to provide a ZQ calibration code to the IO circuit. The semiconductor may also select a register in the register array and replace the content of the selected register with the newly generated ZQ calibration code along with the current voltage/temperature condition of the device. In some examples, the register in the register array is selected according to an update policy. An example update policy may select a register in which the voltage/temperature condition is least frequently matched in response to previous ZQ calibration commands.

Figure 1:
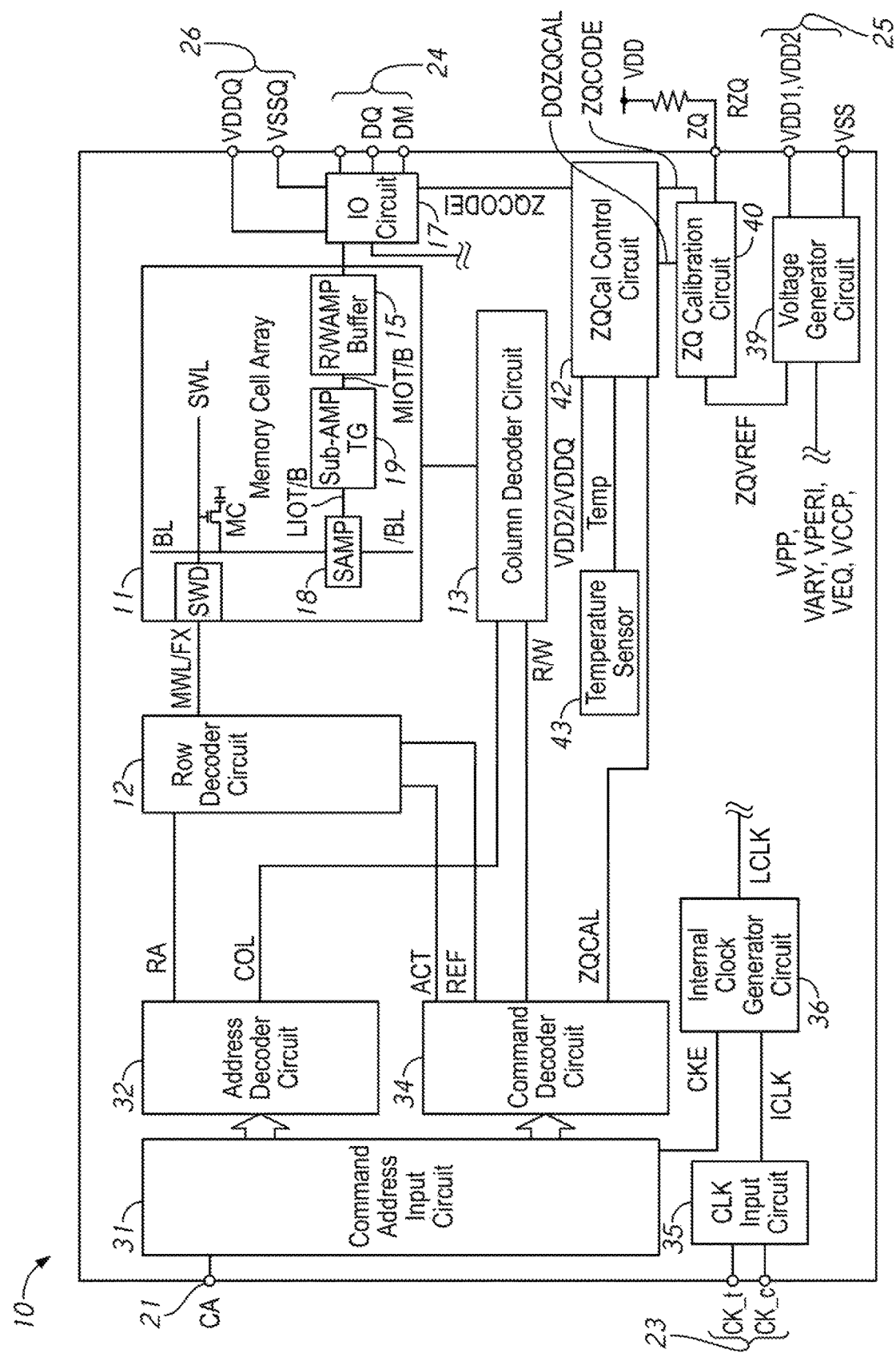
FIG. 1 is a block diagram of a semiconductor device according to some examples described in the disclosure.

FIG. 1 is a block diagram of a semiconductor device 10 according to some examples described in the disclosure. The semiconductor device 10 may be a dynamic random access memory (DRAM) in some embodiments of the disclosure. The semiconductor device 10 includes a memory cell array 11. The memory cell array 11 includes a plurality of word lines WL and a plurality of bit lines BL that intersect each other, with memory cells (MC) disposed at the intersections. The selection of a word line WL is carried out by a row decoder circuit 12, and the selection of the bit line BL is carried out by a column decoder circuit 13.

With further reference to FIG. 1, the sense amplifiers 18 are coupled to corresponding bit lines BL and coupled to local IO line pairs LIOT/B. Local IO line pairs LIOT/B are coupled to main IO line pairs MIOT/B via transfer gates TG 19 which function as switches to read/write amplifiers and buffers 15. Turning to the explanation of a plurality of external terminals included in the semiconductor device 10, the plurality of external terminals includes command and address terminals 21, clock terminals 23, data terminals 24, and power supply terminals 25 and 26.

The command and address terminals 21 are supplied with command and address signals CA. The CA signals provided to the command and address terminals 21 include commands and addresses. Addresses included in the CA signals are transferred via a command/address input circuit 31 to an address decoder circuit 32. The address decoder circuit 32 receives the addresses and supplies a decoded row address signal RA to the row decoder circuit 12, and a decoded column address signal COL to the column decoder circuit 13.

Commands included in the CA signals provided to the command and address terminals 21 are input to a command decoder circuit 34 via the command/address input circuit 31. The command decoder circuit 34 decodes the commands to provide various internal command signals. For example, the command decoder 34 decodes the command signal to generate various internal commands that include a row command signal ACT to select a word line and a column command signal Read/Write (R/W), such as a read command or a write command, to select a bit line; and a refresh command signal REF.

When a row activation command is issued and a row address is timely supplied with the activation command, and a column address is timely supplied with a read command, read data is read from a memory cell MC in the memory cell array 11 designated by these row address and column address. More specifically, the row decoder circuit 12 selects a word line WL indicated by the row address RA so that the associated memory cell MC is subsequently connected to the bit line BL. The read data DQ is output externally from the data terminals 24 via a read/write amplifier 15 and an input/output circuit 17. Similarly, when the row activation command is issued and a row address are timely supplied with the activation command, and a column address is timely supplied with a write command, the IO circuit 17 may receive write data DQ at the data terminals 24. The write data DQ is supplied via the IO circuit 17 and the read/write amplifier 15 to the memory cell array 11 and written in the memory cell MC designated by the row address and the column address.

The clock terminals 23 are supplied with external clock signals CK_t and CK_c, respectively. These external clock signals CK_t and CK_c are complementary to each other and are supplied to a clock input circuit 35. The clock input circuit 35 receives the external clock signals CK_t and CK_c and provides an internal clock signal ICLK. The internal clock signal ICLK is supplied to an internal clock generator 36 and thus a phase controlled internal clock signal LCLK is provided based on the received internal clock signal ICLK and a clock enable signal CKE from the command/address input circuit 31. In a non-limiting example, a DLL circuit may be included in the internal clock generator 36. The phase controlled internal clock signal LCLK is supplied to the input/output circuit 17 and is used as a timing signal for determining an output timing of the read data DQ.

The power supply terminals 25 are supplied with power supply voltages VDD1, VDD2 (collectively referred to as VDD), and VSS. These power supply voltages VDD1, VDD2, and VSS are supplied to an internal voltage generator circuit 39. The internal voltage generator circuit 39 provides various internal voltages VPP, VARY, VPERI, VEQ, and VCCP.

The internal potential VCCP is a potential to be mainly used in the row decoder circuit 12. The internal potential VARY and VEQ are potentials to be used by the sense amplifier 18, transfer gates 19 and/or read/write amplifiers 15. When the sense amplifier 18 is activated, the read data read out is amplified by driving one of the paired bit lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are supplied with power supply voltages VDDQ and VSSQ. These power supply voltages VDDQ and VSSQ are supplied to the IO circuit 17. The power supply voltages VDDQ and VSSQ may be the same voltages as the power supply voltages VDD2 and VSS that are supplied to the power supply terminals 25, respectively. However the dedicated power supply voltages VDDQ and VSSQ may be used for the IO circuit 17 so that power supply noise generated by the IO circuit 17 does not propagate to the other circuit blocks of device 10.

In the semiconductor device 10, a calibration terminal ZQ is provided. The calibration terminal ZQ is coupled to a power supply potential VDDQ via a reference resistor RZQ, which is provided on a memory module substrate or a motherboard. The reference resistor RZQ includes a resistor that is referenced during a calibration operation. The impedance of the reference resistor RZQ is used as a reference impedance for a ZQ calibration circuit 40. In some examples, the voltage generator circuit 39 provides a reference potential ZQVREF signal to the ZQ calibration circuit 40. When the calibration circuit 40 is activated by a calibration signal DOZQCAL, the calibration circuit 40 performs a calibration operation by referencing the impedance of the external reference resistor RZQ and the reference potentials ZQVREF. In performing the calibration operation, the ZQ calibration circuit 40 may provide a ZQ calibration code ZQCODE to the IO circuit 17. In some examples, the ZQ calibration code may include multiple bits specifying the impedance of respective pull-up or pull-down circuits in the IO circuit 17.

In some examples, the semiconductor device 10 may include a ZQ calibration control circuit 42 coupled to the ZQ calibration circuit 40 and the IO circuit 17. The command decoder circuit 34 may provide a ZQ calibration command ZQCAL to the ZQ calibration control circuit 42. At the arrival of each ZQCAL command, the ZQ calibration control circuit 42 may be configured to provide the ZQ calibration code ZQCODE1 to the IO circuit 17. In some examples, the ZQCODE1 may be the ZQ calibration code ZQCODE provided by the ZQ calibration circuit 40 and supplied by the ZQ calibration control circuit 42 directly to the IO circuit 17. Alternatively, and/or additionally, the ZQCODE1 may be a pre-stored ZQ calibration code retrieved by the ZQ calibration control circuit to provide to the IO circuit 17. In other words, the ZQ calibration control circuit may be configured to activate a ZQ calibration and supply the calibration code provided by the ZQ calibration circuit 40 to the IO circuit 17 or skip the ZQ calibration and retrieve a pre-stored calibration code to be provided to the IO circuit 17.

In some examples, the ZQ calibration control circuit 42 may pre-store multiple ZQ calibration codes provided by the ZQ calibration circuit 40 from previous calibrations or an initial calibration table obtained in a back-end testing. In some examples, the ZQ calibration control circuit 42 may be provided with a voltage signal and a temperature signal TEMP respectively indicative of the voltage condition and the temperature condition of the semiconductor device. For example, the voltage signal may be indicative of a power supply voltage of the semiconductor device 10, e.g., VDD2 or VDDQ. The temperature signal TEMP may be indicative of the operating temperature of the semiconductor device 10. For example, the temperature signal TEMP may be provided by a temperature sensor 43. When pre-storing the ZQ calibration code, the ZQ calibration control circuit 42 may also store an operating condition, such as a voltage/temperature condition associated with the ZQ calibration code.

In some examples, a voltage/temperature condition may include a voltage condition and/or a temperature condition. A voltage condition may include a voltage value represented by a voltage signal. A temperature condition may include a temperature value represented by a temperature signal. In some examples, the voltage/temperature condition may include the voltage value and the temperature value at the time when the ZQ calibration is performed. For example, the voltage value may be the power supply voltage of the semiconductor device at the time the ZQ calibration is performed. The temperature value may be the operating temperature of the semiconductor device at the time the ZQ calibration is performed. Alternatively, the voltage value may be a voltage variation relative to a reference voltage when the ZQ calibration is performed, for example, 5% or −5% of the reference voltage. Multiple ZQ calibration codes may be pre-stored in a register array, each calibration code is associated with a respective voltage/temperature condition at the time when an instance of ZQ calibration operation is executed to provide the respective calibration code, for example, by the ZQ calibration circuit 40.

In some examples, responsive to a ZQ calibration command ZQCAL, the ZQ calibration control circuit 42 may be configured to determine whether to perform a ZQ calibration or to skip the ZQ calibration. In some examples, if a current voltage/temperature condition of the semiconductor device does not match any of the pre-stored voltage/temperature condition in a register array, then the ZQ calibration control circuit 42 may provide an active DOZQCAL signal to activate the ZQ calibration circuit 40. The ZQ calibration circuit 40 may provide a ZQ calibration code, e.g., ZQCODE. The ZQ calibration control circuit 42 may supply the calibration code ZQCODE provided by the ZQ calibration circuit to the IO circuit 17 as ZQCODE1. In some examples, if the current voltage/temperature condition matches a pre-stored voltage/temperature condition in the register array, then the ZQ calibration control circuit 42 may skip the ZQ calibration by providing an inactive DOZACAL signal to deactivate the ZQ calibration circuit 40. Instead, the ZQ calibration control circuit 42 may retrieve the pre-stored calibration code associated with the matched voltage/temperature condition and provide the retrieved calibration code to the IO circuit 17 as a ZQCODE1.

In some examples, the calibration code signal ZQCODE, ZQCODE1 may include a first portion CODEPU and a second portion CODEPD. For example, ZQCODE and ZQCODE1 each may include 14 bits, of which a first portion (e.g., 7 bits) may comprise the CODEPU and a second portion (e.g., 7 bits) may comprise the CODEPD. The CODEPU and CODEPD may be used for respectively calibrating pull-up and pull-down circuits in the IO circuit 17. As a result, the impedance of an output buffer OB in the IO circuit 17 is adjusted. This is further explained with reference to FIG. 2

Figure 2:
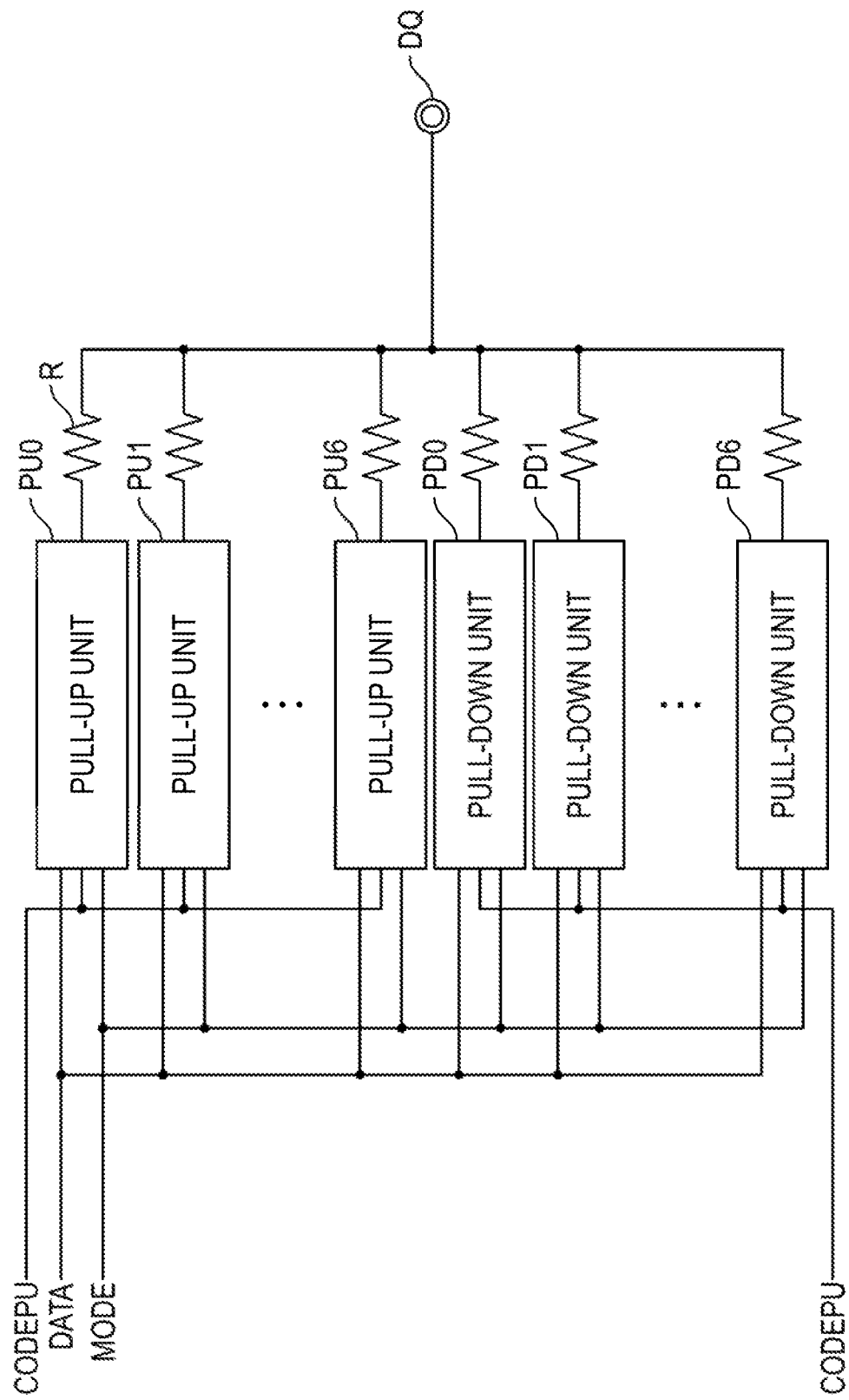
FIG. 2 is a block diagram showing an output buffer in an input/output circuit, in which a portion allocated to one data input/output terminal DQ is shown.

FIG. 2 is a block diagram showing an output buffer in an input/output circuit. The output buffer of FIG. 2 is for one data input/output terminal DQ. In some examples, the output buffer OB includes seven pull-up units PU0 to PU6 and seven pull-down units PD0 to PD6 for one data input/output terminal EX). Output nodes of the pull-up units PU0 to PU6 and pull-down units PD0 to PD6 are coupled in common to a corresponding data input/output terminal EX) via resistors R. The pull-up units PU0 to PU6 have the same circuit configuration, and are collectively referred to as "pull-up units PU" when no distinction is required. Similarly, the pull-down units PD0 to PD6 have the same circuit configuration, and are collectively referred to as "pull-down units PD" when no distinction is required.

The pull-up unit PUi (i=0 to 6) and the pull-down unit PDi (i=0 to 6) are paired. The number of the pairs of the units to be used is specified by the mode signal MODE output from a mode register. To the pull-up units PU0 to PU6 and pull-down units PD0 to PD6, the internal data DATA is supplied from a FIFO circuit. If the internal data DATA is at a high logical level, one or more pull-up units specified by the mode signal MODE among the pull-up units PU0 to PU6 will be activated. As a result, the data input/output terminal EX) is driven to a high logical level. When the internal data DATA indicates a low level, one or more pull-down units specified by the mode signal MODE among the pull-down units PD0 to PD6 will be activated. As a result, the data input/output terminal DQ is driven to a low level.

The impedance of each of the activated pull-up units PU0 to PU6 is specified by the code signal CODEPU. Similarly, the impedance of each of the activated pull-down units PD0 to PD6 is specified by the code signal CODEPD.

According to various embodiments, the impedance target value of the pull-up units PU0 to PU6 is 2RZQ, where RZQ is the resistance of a reference resistor. The impedance target value of the pull-down units PD0 to PD6 is RZQ. Accordingly, if j pairs of the units are used as specified by the mode signal MODE, the impedance at the time of high-level outputting is 2RZQ/j, and the impedance at the time of low-level outputting is RZQ/j. In this manner, the impedance of the pull-up unit PU and pull-down unit PD is adjusted based on the code signals CODEPU and CODEPD, respectively.

Figure 3:
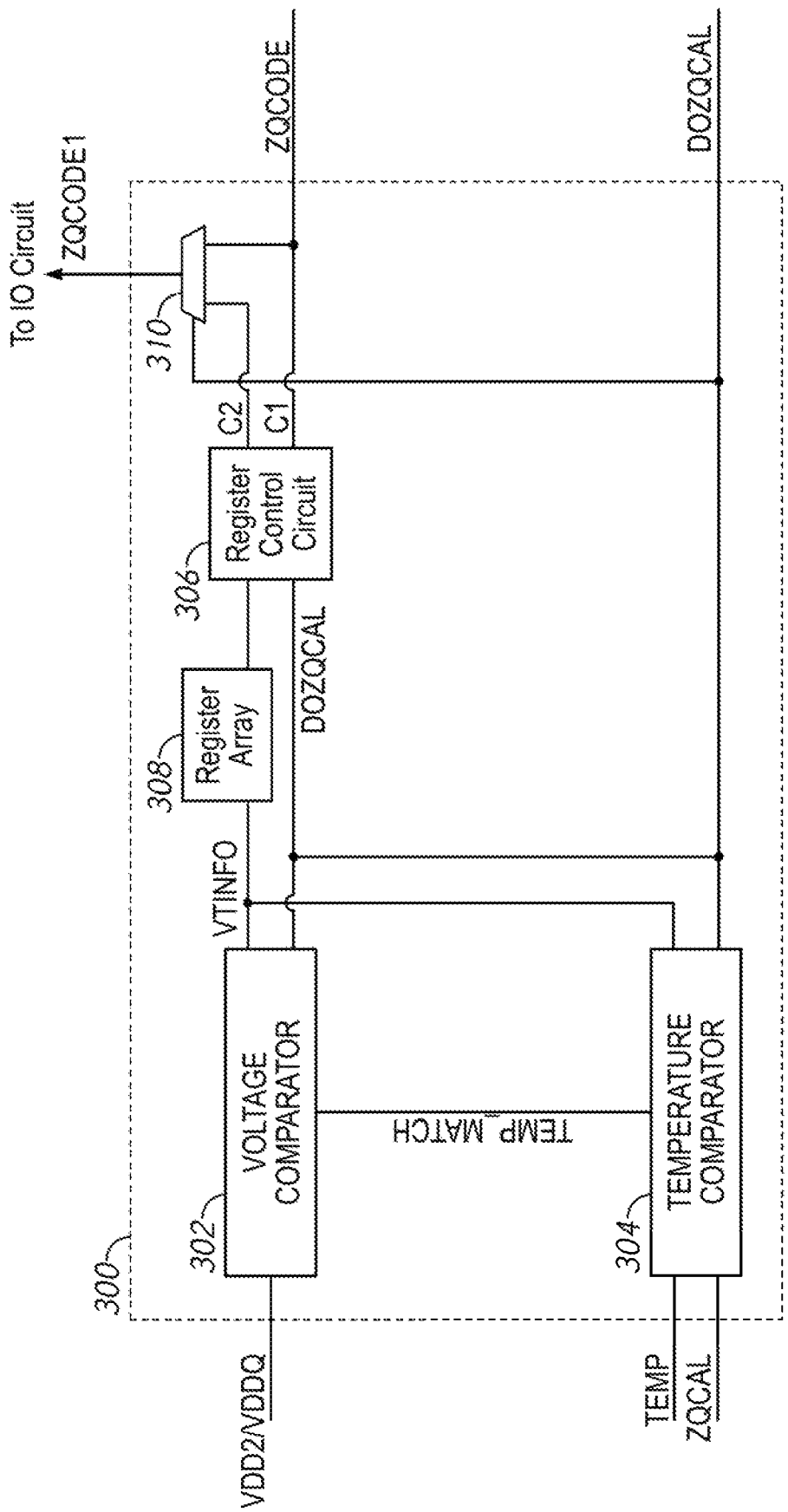
FIG. 3 is a diagram of a ZQ calibration control circuit according to some examples described in the disclosure.

FIG. 3 is a diagram of a ZQ calibration control circuit according to some examples described in the disclosure. In some examples, the ZQ calibration control circuit 300 may be an example implementation of the ZQ calibration control circuit 42 (in FIG. 1). The ZQ calibration control circuit 300 may include a voltage comparator 302, a temperature comparator 304 and a switching circuit 310. The voltage comparator 302 may be provided with a voltage signal, e.g., a power supply voltage such as VDD2, VDDQ. The power supply voltage may be provided from power supply terminal of the semiconductor device. The temperature comparator 304 may be provided with a temperature signal TEMP. The temperature signal TEMP may be provided from a temperature sensor configured to monitor the operating temperature of the semiconductor device (e.g., 10 in FIG. 1). The temperature signal may include a temperature value in one or more data bits.

With further reference to FIG. 3, the ZQ calibration control circuit 300 may further include a register control circuit 306 coupled to the voltage comparator 302 and the temperature comparator 304. The register control circuit 306 may be configured to retrieve pre-stored calibration codes along with associated pre-stored voltage/temperature conditions. The voltage/temperature condition may include a voltage condition and/or temperature condition of the semiconductor device (e.g., 10 in FIG. 1). For example, the voltage condition may include a voltage value indicating the power supply of the semiconductor device, e.g., VDD2, VDDQ. Alternatively and/or additionally, the voltage condition may include a voltage variation relative to a reference voltage. The temperature signal obtained from the temperature sensor may include a temperature value indicative of a temperature condition. In some examples, the temperature value may be indicative of the operating temperature of the semiconductor device. In some examples, the calibration codes and associated voltage/temperature conditions may be stored in a register array 308 coupled to the register control circuit 306. The content of the register array 308 is further described with reference to FIG. 4.

FIGS. 4A and 4B are examples of memory content in a register array according to some examples described in the disclosure. In FIG. 4A, the register array 400 may be implemented in the register array 308. The register control circuit 306 (in FIG. 3) may be configured to control the data write and read operations of the register array 400. In some examples, the register array 400 may include multiple registers, e.g., Reg 0, Reg 1, . . . Reg N. Each of the registers may include information represented by multiple bits, as shown in FIG. 4B. In FIG. 4B, a register 420 may be an example data configuration of the registers in the register array 400. The register 420 may include a first portion (voltage field) storing a voltage condition (e.g., a voltage value or a voltage variation value), a second portion (temperature field) storing a temperature condition (e.g., a temperature) and a third portion (ZQ code field) storing the ZQ calibration code associated with the voltage/temperature condition. For an instance of ZQ calibration, for a given voltage and temperature variation of the semiconductor device, the ZQ calibration circuit (e.g., 40 in FIG. 1) may provide a corresponding ZQ calibration code. The ZQ calibration code, along with the voltage/temperature condition at the time when the ZQ calibration code is generated may be stored in the register 420. For example, the voltage and temperature variation at the time when the ZQ calibration is performed and the corresponding calibration code provided by the ZQ calibration are stored in a register and associated together. Each register in the register array 308 may store a ZQ calibration code associated with a unique voltage/temperature condition. A suitable number of registers may be included in the register array. Further details of retrieving data from and writing data to a register may be described in the context of operation of the ZQ calibration control circuit 300.

Returning to FIG. 3, the register control circuit 306 may be configured to save or retrieve a voltage/temperature condition to/from the register array 308. The voltage/temperature condition may include a voltage condition and/or temperature condition, such as a voltage variation and/or a temperature value. The register array 308 may provide the pre-stored voltage/temperature conditions to the voltage comparator 302 and the temperature comparator 304 via the VTINFO signal line. The VTINFO signal on the VTINFO signal line may include a first portion and a second portion, respectively including the voltage condition and the temperature condition stored in one or more registers in the register array (e.g., 308). The voltage comparator 302 and the temperature comparator 304 may be configured to determine whether there is a match between a current voltage/temperature condition of the semiconductor device (e.g., VDD2/VDDQ, TEMP) and any pre-stored voltage/temperature condition provided in the VTINFO signal. If the current voltage/temperature condition of the semiconductor device does not match any pre-stored voltage/temperature condition in the registers in the register array, then an active calibration signal DOZQCAL is provided by the ZQ calibration control circuit 300. If the current voltage/temperature condition of the semiconductor device matches a pre-stored voltage/temperature condition in a register in the register array, then an inactive DOZQCAL signal is provided.

With further reference to FIG. 3, now the operations of voltage comparator 302 and temperature comparator 304 are explained. In some examples, the temperature comparator 304 may be coupled to the voltage comparator 302 and configured to provide a control signal TEMP_MATCH to the voltage comparator. The temperature comparator 304 may also be coupled to command decoder circuit (e.g., 34 in FIG. 1) to receive a ZQ calibration command, e.g., ZQCAL, from the command decoder circuit. The temperature comparator 304 may be configured to compare a temperature value in the temperature signal TEMP provided by the temperature sensor to the temperature condition(s) in the VTINFO signal, responsive to an ZQCAL command, to provide a match signal TEMP_MATCH. The VTINFO signal may include pre-stored voltage conditions and/or temperature conditions in one or more registers in the register array (e.g., 308). If the temperature value in the temperature signal and the temperature condition in one or more registers in the register array 308 match, the temperature comparator may provide an active signal TEMP_MATCH indicating that the temperature provided by the sensor matches one or more pro-stored temperature values. The active TEMP_MATCH signal may subsequently activate the voltage comparator 302. If no temperature condition in the VTINFO signal matches the temperature value in the TEMP signal, the temperature comparator 304 may provide an inactive TEMP_MATCH signal, indicating that the current temperature does not match any pre-stored temperature value in the register array. The inactive TEMP_MATCH signal subsequently deactivates the voltage comparator 302.

When no temperature condition in the VTINFO signal matches the temperature value in the TEMP signal, the temperature comparator 304 may provide an active calibration signal DOZQCAL. The active calibration signal DOZQCAL is provided to the ZQ calibration circuit (e.g., 40 in FIG. 1) to activate the ZQ calibration circuit. In other words, if none of the pre-stored temperature conditions in the register array 308 matches the temperature value in the TEMP signal, then the ZQ calibration control circuit 300 is configured to activate the ZQ calibration operation and supply the ZQ calibration code provided by the ZQ calibration circuit to the IO circuit (e.g., 17 in FIG. 1).

In some examples, the temperature value in the TEMP signal and the temperature condition in the VTINFO may include any suitable number of bits. For example, the TEMP signal provided to the temperature comparator 304 and the temperature field (in FIG. 4B) of a register may include 8 bits that correspond to the digital output of the temperature sensor of the semiconductor device (e.g., 10 in FIG. 1). In some examples, an 8-bit temperature signal may be used to represent −89° C. to 167° C. at a resolution of 1° C. In some examples, the TEMP provided to the temperature comparator 304 and the temperature field (in FIG. 4B) of a register may include 7 bits that correspond to the 7 most significant bits of the digital output of the temperature sensor, while leaving out the least significant bit. This will result in the same temperature range as the original 8-bit digital output, but with reduced temperature resolution at 2° C.

In some examples, the temperature comparator 304 may be implemented in a content address memory (CAM). The CAM may also contain the register array 308. A CAM is generally configured to allow a search by content. For example, the registers in the CAM may be searched by the temperature values in the temperature fields. Once one or more registers are found to match the temperature value being searched, the associated voltage condition(s) of the matched temperature value may be made available to the voltage comparator via the VTINFO signal line.

When a pre-stored temperature value matches the temperature value in the TEMP signal, the voltage comparator 302 in the ZQ calibration control circuit 300 is activated responsive to the active TEMP_MATCH signal. The voltage comparator 302 may be configured to compare a voltage value in a voltage signal provided to the voltage comparator to voltage conditions pie-stored in the register array 308 via the VTINFO signal line. The voltage signal may include a current voltage condition of the semiconductor device, e.g., VDD2/VDDQ. The voltage conditions) in the VTINFO signal may correspond to voltage conditions in one or more registers in the register array 308, where the one or more registers contain the matched temperature conditions from the temperature comparator 304. In some examples, the voltage field of a register may include a voltage variation (e.g., a deviation of the power supply voltage, e.g., VDD2/VDDQ relative to a reference voltage) and represented in voltage code. This is further explained with reference to FIGS. 5A-5B.

Figure 5A:
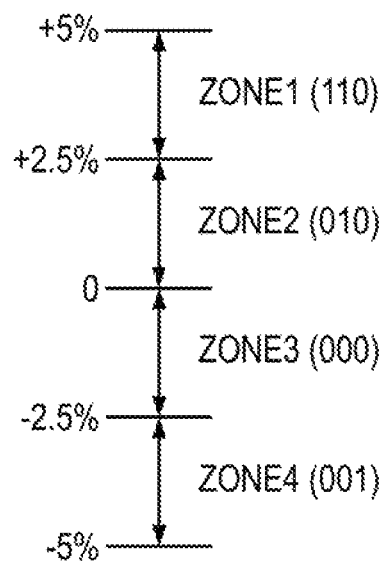
FIG. 5A is an example representation of voltage variations according to some examples described in the disclosure.

FIG. 5A is an example representation of voltage variations according to some examples described in the disclosure. In some examples, a voltage variation may be represented by a zone. For example, a typical range of voltage variation (e.g., −5%~5% as typically allowed in a power supply in a semiconductor device, e.g., 10 in FIG. 1) may be divided into four zones, each represented by a three-digit voltage code which may be included in the voltage field of VTINFO signal or the voltage field in a register (e.g., 420 in FIG. 4B). As shown in FIG. 5A, zone 1 defines a 2.5%~5% voltage variation range and is represented by a voltage code "110." Similarly, zone 2 defines a 0~2.5% range and is represented by a voltage code "010"; zone 3 defines a −2.5%~0 range and is represented by "000"; and zone 4 defines a −5%~2.5% range and is represented by "001." FIG. 5A only shows an example of zones and assignment of voltage codes. It is appreciated that various configurations of zones may be used to provide various assignment of voltage codes in a similar manner. Similarly, various number of bits in a voltage code may be used to represent a zone.

Figure 5B:
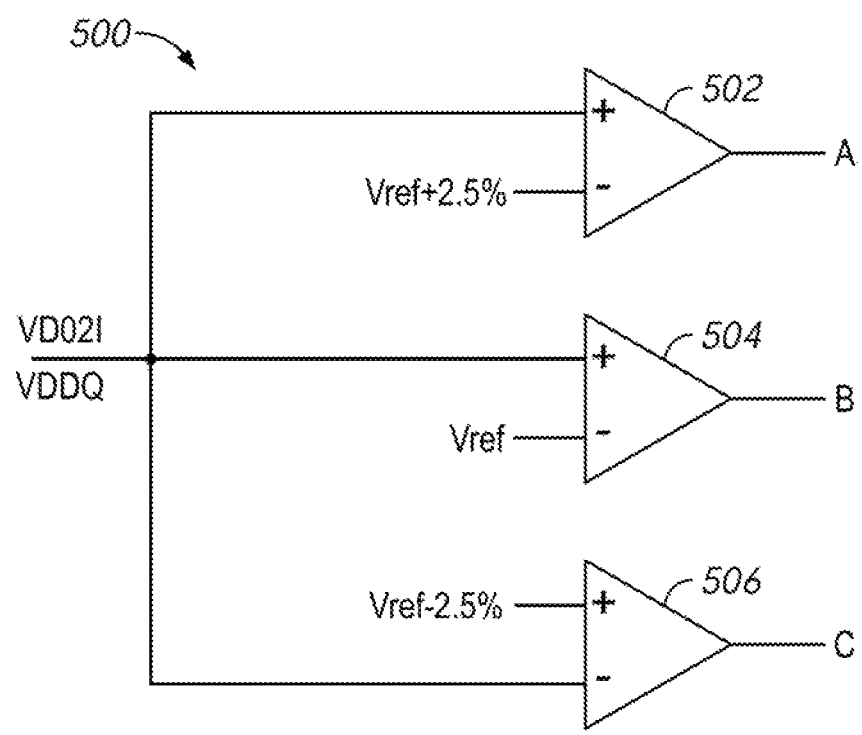
FIG. 5B is a diagram of an example voltage coder circuit for converting a voltage to a voltage code according to some examples described in the disclosure.

FIG. 5B is a diagram of an example voltage coder circuit for converting a voltage to a voltage code according to some examples described in the disclosure. A voltage coder circuit 500 may be implemented in the voltage comparator (e.g., 302 in FIG. 3) and configured to convert a voltage signal to a voltage code, such as a code indicative of the voltage variation zone shown in FIG. 5A. In some examples, the voltage coder circuit 500 may include multiple amplifiers 502, 504, 506. Each amplifier may be provided at one input terminal with the voltage signal, e.g., the power supply VDD2/VDDQ, and at the other input terminal a reference voltage for measuring the voltage variation. For example, first terminals (e.g., non-inverting terminals) of the amplifiers 502 and 504 may be provided with the power supply voltage VDD2/VDDQ. A reference voltage Vref is provided to a second terminal (e.g., an inverting terminal) of the amplifier 504. In some examples, the Vref may be a ZQ reference voltage (e.g., ZQVREF) provided by a voltage generator circuit (e.g., 39 in FIG. 1). In some examples, the reference voltage Vref may be a bandgap voltage reference. For example, the reference voltage may be a portion of VDD2/VDDQ voltages, e.g., half or one-third of VDDQ, provided by a voltage generator circuit, such as 39 in FIG. 1. The amplifiers 502 and 506 may be respectively provided with a voltage higher and lower than the reference voltage Vref. For example, the amplifier 502 may be provided with a reference voltage at 2.5% higher than the reference voltage Vref at the inverting terminal. The amplifier 506 may be provided with a reference voltage at 2.5% lower than the reference voltage Vref at the non-inverting terminal.

The multiple amplifiers may be configured to provide the voltage code of voltage variation by forming a multi-bit voltage code at the output of the multiple amplifiers. In a non-limiting example, the output of the amplifiers 502, 504, 506 ABC may represent a 3-bit voltage code. For example, if the voltage VDD2/VDDQ is above Vref but has less than 2.5% of variation (see zone 2 in FIG. 5A), then the amplifier 504 is on, while amplifiers 502 and 506 are off. Consequently, ABC will have the code 010. In another example, if the voltage VDD2/VDDQ has larger than 2.5% of negative voltage variation (means the voltage is less than the reference voltage, see zone 4 in FIG. 5A), then amplifiers A and B are off, and amplifier 506 is on, thus ABC will have the code 001. In another example, if the voltage VDD2/VDDQ is above 2.5% of voltage variation (see zone 1 in FIG. 5A), then the amplifiers A and B will be on and the amplifier C will be off, thus ABC will have the code 110. In another example, if the voltage VDD2/VDDQ is below the reference voltage but has less than 2.5% of negative voltage variation (see zone 3 in FIG. 5A), then all of the amplifiers 502, 504, 506 will be off. The ABC code will be zero (000). It is appreciated that any suitable number of bits may be used to represent to form a voltage code in a similar manner, in which the number of bits in the voltage code corresponds to the number of amplifiers in the voltage coder circuit.

Returning to FIG. 3, the voltage field in the VTINFO signal may also represent the voltage code in the same number of bits (e.g., 3 bits as defined in FIG. 5A). In comparing a current voltage condition (e.g., VDD2/VDDQ) with a voltage condition in VTINFO, the voltage comparator 302 may be configured to convert the voltage signal to a multi-bit voltage code, such as ABC (in FIG. 5B), then compare the voltage code of the voltage signal with the voltage field in VTINFO. In some examples, the voltage comparator 302 may determine that the voltage condition in the current voltage signal and the voltage condition in the VTINFO signal match if the difference between the voltage code of the voltage signal and the voltage code contained in the voltage field of VTINFO is no greater than one voltage variation zone. Conversely, the voltage comparator 302 may determine that the voltage signal and the VTINFO do not match if the difference between the voltage code of the voltage signal and the voltage code contained in the voltage field of VTINFO is greater than one voltage variation zone.

In some examples, with reference to FIG. 5A, if a voltage signal is convened to a voltage code for zone 1 (110) and the voltage field of VTINFO contains a voltage code for zone 2 (010), or vice versa, then the difference between the voltage conditions in the voltage signal and the VTINFO signal is one voltage variation zone. Then the voltage conditions in the two signals are deemed to match. Conversely, if the difference between the voltage conditions in the voltage signal and the VTINFO signal is greater than one voltage variation zone (e.g., zone 1 and zone 4; zone 2 and zone 4; or zone 1 and zone 3 etc.), then the voltage conditions in the two signals are deemed to not match.

Figure 6:
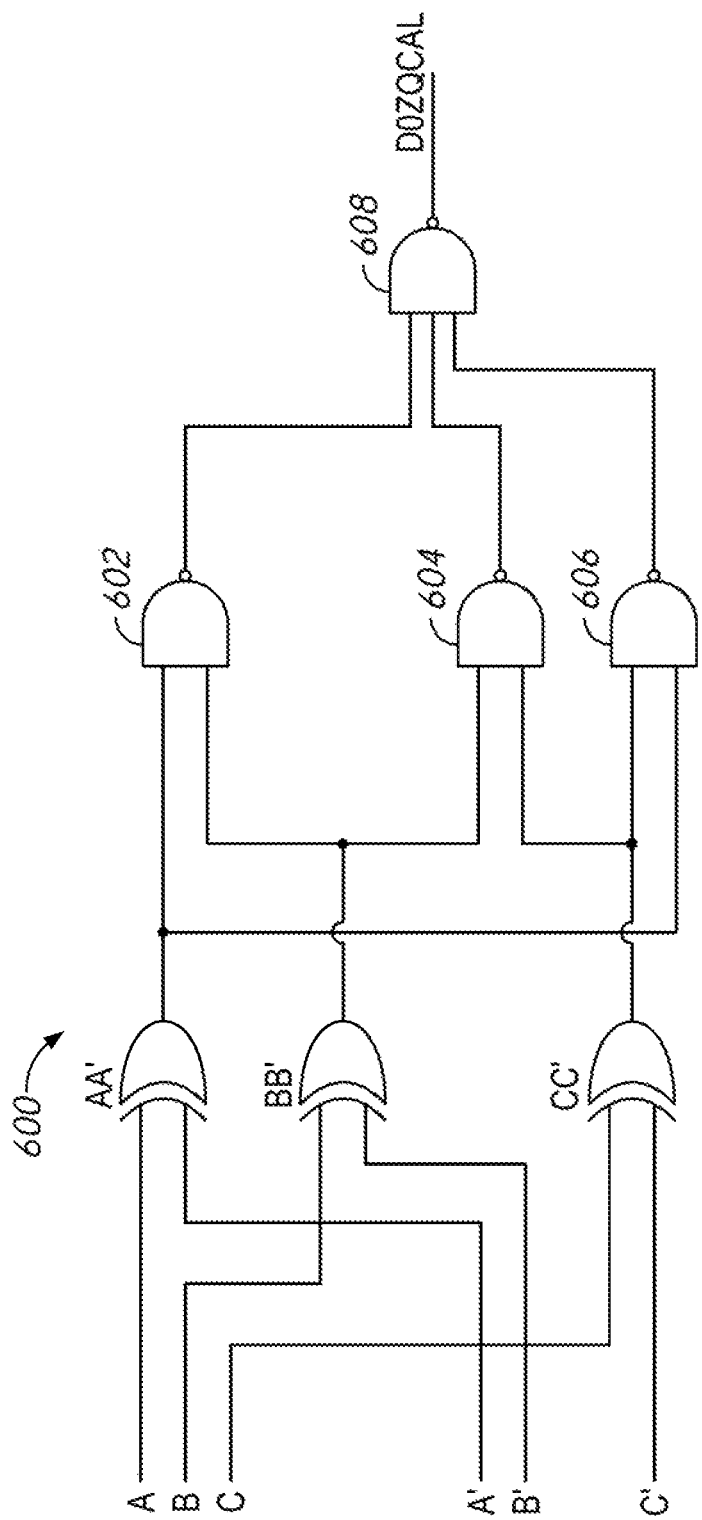
FIG. 6 is a diagram of a circuit implementing a voltage comparator according to some examples described in the disclosure.

FIG. 6 is a diagram of a circuit implementing at least a portion of a voltage code comparator according to some examples described in the disclosure. A voltage code comparator 600 may be implemented in the voltage comparator (e.g., 302 in FIG. 3) and configured to compare a first voltage variation and a second voltage variation, both represented by a voltage code. Example voltage codes are shown in FIG. 5A. It is appreciated that other voltage code assignment may be possible. With reference to FIG. 6, the first voltage code may be represented by ABC, and the second voltage code A'B'C'. The voltage code comparator 600 may include a first group of logic gates, e.g., AA', BB' and CC'. As the notations of the logic gates indicate, the logic gate AA' is coupled to first corresponding bits, A and A', of the first and second voltage codes, respectively. The logic gate BB' is coupled to the second corresponding bits, B and B' of the first and second voltage codes, respectively. The logic gate CC' is coupled to the third corresponding bits, C and C' of the first and second voltage codes, respectively.

In some examples, each of the first group of logic gates is an XOR gate that provides an output indicating whether or not the corresponding bits in the first and second voltage codes are the same. For example, the logic gate AA' (e.g., an XOR gate) is configured to provide a high logical state output when the input terminals have opposite logical states. In a non-limiting example, if A and A' contain different bits, e.g., 01 or 10, then the logic gate AA' provides a high logical state output. If A and A' contain the same bits, e.g., 00 or 11, then the logic gate AA' provides a low logical state output.

With further reference to FIG. 6, the output of the first group of logic gates are further provided to a second group of logic gates coupled to the first group of logic gates. Examples of the second group of logic gates include logic gates 602, 604 and 606. In some examples, each of the logic gates in the second group may be a NAND gate. Each NAND gate in the second group of logic gates may be coupled to the output of two logic gates in the first group of logic gates. For example, the output of logic gates AA' and BB' are coupled to the logic gate 602; the output of the logic gates BB' and CC' are coupled to the logic gate 604; and the output of the logic gates AA' and CC' are coupled to the logic gate 606. For each NAND gate 602, 604, 606, when both input signals are at a high logic state the output is at a low logic state; otherwise, the output of the NAND gate is at a high logic state. The voltage code comparator 600 may further include an additional NAND gate 608 coupled to the second group of logic gates. For example, the input of the additional NAND gate 608 are coupled to the output of the second group of logic gates. The output of the additional NAND gate 608 is coupled to the ZQ calibration circuit (e.g., 40 in FIG. 1) to provide the DOZQCAL signal to the ZQ calibration circuit.

With further reference to FIG. 6, as described above, the voltage code comparator 600 is now configured to provide an active DOZQCAL signal when at least two pairs of corresponding bits in the first and second voltage codes (e.g., ABC and A'B'C') have different bits. For example, when ABC=110 (corresponding to zone 1 in FIG. 5A) and A'B'C'=000 (corresponding to zone 3 in FIG. 5A), both the first and second corresponding bits in ABC and A'B'C' are different. This causes the output of logic gates AA' and BB' to be at a high logical state and the output of logic gate CC' to be at a low logical state, which causes the output of logical gate 602 to be at a low logical state. This causes the additional logic gate 608 to provide a high logical state output—an active DOZQCAL signal. In another example, when ABC=110 (corresponding to zone 1 in FIG. 5A) and A'B'C'=010 (corresponding to zone 1 in FIG. 5A), only the first corresponding bits in ABC and A'B'C' are different. This causes the output of the logic gate AA' to be at a high logical state while the output of the lope gates BB' and CC' at low. Thus the output of all of the gates 602, 604, 606 are at a high logical state, causing the output of the additional logic gate 608 to provide a low logical state output—an inactive DOZQCAL signal.

The table below illustrates various scenarios of voltage variations and the corresponding DOZQCAL signal according to various embodiments described with reference to FIGS. 3-6. (See zone division and voltage code assignment in FIG. 5A).

| Zone change | Voltage variation range | Voltage code of voltage signal or pre-stored voltage representation | Voltage code of pre-stored voltage representation or voltage signal | DOZQCAL |
|---|---|---|---|---|
| One (zone 1 ←→ 2) | 0%~5% | 110 | 010 | Inactive |
| Two (zone 1 ←→ 3) | -2.5%~5% | 110 | 000 | Active |
| Three (zone 1 ←→ 4) | -5%~5% | 110 | 001 | Active |
| One (zone 2 ←→ 3) | -2.5%~5% | 010 | 000 | Inactive |

-continued

| Zone change | Voltage variation range | Voltage code of voltage signal or pre-stored voltage representation | Voltage code of pre-stored voltage representation or voltage signal | DOZQCAL |
|---|---|---|---|---|
| Two (zone 2 ←→ 4) | -5%~2.5% | 010 | 001 | Active |
| One (zone 3 ←→ 4) | -5%~0% | 000 | 001 | Inactive |

Returning to FIG. 3, in some examples, if the difference between the voltage code for VDD2/VDDQ and the voltage field in the VTINFO (or in any register) is no greater than one zone, then the voltage comparator 304 may determine there is a voltage match. In the table above, the zone changes between zone 1 and zone 2, zone 2 and zone 3, and zone 3 and zone 4 all result in one zone change. In such case, the power supply, e.g., VDD2/VDDQ and the voltage condition in VTINFO (or a pre-stored voltage condition in the register array 308) are considered to match. As shown in the table above, all of the zone pairs that result in one zone change correspond to a maximum range of 5% (e.g., 0%~5% for zone 1 and zone 2; -2.5%~2.5% for zone 2 and zone 3; and -5%~0% for zone 3 and zone 4). It is appreciated that in some embodiments other zone change may be defined and used for determining a voltage match.

Recall that the voltage comparator 302 is activated responsive to an active TEMP_MATCH signal. This means that when there is a voltage match, both the temperature and the voltage corresponding to a prior calibration have been matched. As shown in FIGS. 3 and 6, responsive to the voltage match, the voltage comparator 302 in the ZQ calibration control circuit 300 may provide an inactive DOZQCAL signal to the ZQ calibration circuit (e.g. 40 in FIG. 1) to deactivate the ZQ calibration circuit. Responsive to the inactive DOZQCAL signal, the register control circuit 306 may be configured to retrieve the pre-stored calibration code associated with the matched voltage/temperature condition and provide the retrieved calibration code as C2.

With further reference to FIG. 3, in some examples, the switching circuit 310 may be a multiplexer. The switching circuit 310 may be coupled at one terminal to the register control circuit 306 (to receive the pre-stored calibration code C2) and also coupled at another terminal to the ZQ calibration circuit (e.g., 40 in FIG. 1) to receive the calibration code ZQCODE provided by the ZQ calibration circuit. When there is a voltage match, the inactive DOZQCAL signal may cause the switching circuit 310 to provide the pre-stored calibration code C2 to the IO circuit (e.g., 17 in FIG. 1) as ZQCODE1.

In some examples, when there is not a voltage match, the voltage comparator 302 may provide an active DOZQCAL signal on the DOZQCAL signal line. The DOZQCAL signal line may be coupled to the ZQ calibration circuit (shown in FIG. 1) so that an active DOZQCAL signal may activate the ZQ calibration circuit (e.g., 40 in FIG. 1) to cause the ZQ calibration circuit to provide a calibration code ZQCODE. The active DOZQCAL signal may also control the switching circuit 310 to supply the ZQCODE provided by the ZQ calibration circuit to the IO circuit (e.g., 17 in FIG. 1) as ZQCODE1.

With further reference to FIG. 3, when there is no temperature match or no voltage match, the ZQ calibration control circuit 300 is configured to provide an active DOZ- QCAL signal, which will cause the register control circuit 306 to update the registers with the new ZQCODE provided by the ZQ calibration circuit (e.g., 40 in FIG. 1). The ZQCODE is provided to the register control circuit 306 as a code C1. In some examples, the code C1 may be uploaded to the register array 308 via control of the register control circuit 306. In uploading a new calibration code to the registers, the register control circuit 306 may implement an update policy to determine which register in the register array is to be replaced with the new calibration code. This is further described with reference to FIG. 4A.

Returning to FIG. 4A, the register array may include a plurality of counters, e.g., counter 0, 1, 2, . . . , each counter is associated with a respective register in the register array. For example, counter 0 is associated with register 0, counter 1 is associated with register 1, and so on. In some examples, each counter is configured to count the number of times the voltage/temperature condition in the associated register matches the voltage/temperature condition of the semiconductor device (e.g., VDD2/VDDQ and TEMP). In other words, the count value in each counter also indicates the number of times the calibration code pre-stored in the associated register is retrieved by the ZQ calibration control circuit (e.g., 300 in FIG. 3) and provided to the IO circuit (e.g., 17 in FIG. 1). In operation, the voltage and temperature of a semiconductor device may have a swing range. The higher a counter in the register array is, the more likely the voltage/temperature condition stored in the register associated with the counter will be visited again in a future swing. As such, the update policy may include keeping the register with a higher count and replacing a register with a lower count.

Returning to FIG. 3, in an example implementation, when DOZQCAL becomes active, the register control circuit 306 may select a register, of which the associated counter contains the lowest count among other counters in the register array. The register control circuit 306 may subsequently replace the calibration code in the selected register with the new ZQCODE provided by the ZQ calibration circuit (e.g., 40 in FIG. 1). The register control circuit 306 may also replace the voltage and temperature fields in the register with the current voltage/temperature condition of the semiconductor device at the time of the ZQ calibration. For example, the voltage field of the selected register may be replaced with a voltage code of the current voltage. The temperature field may be replaced with the current temperature value. The counter associated with the selected register may be subsequently reset, e.g., to zero or one, or an initial value. In some examples, when the DOZQCAL becomes inactive, the calibration code is retrieved from the register array and supplied to the IO circuit instead of being provided by the ZQ calibration circuit. In such case, the counter associated with the register storing the retrieved calibration code increments by one count. As such, the frequency of any voltage/temperature condition being matched during the operation of the ZQ calibration control circuit is properly stored.

Figure 9:
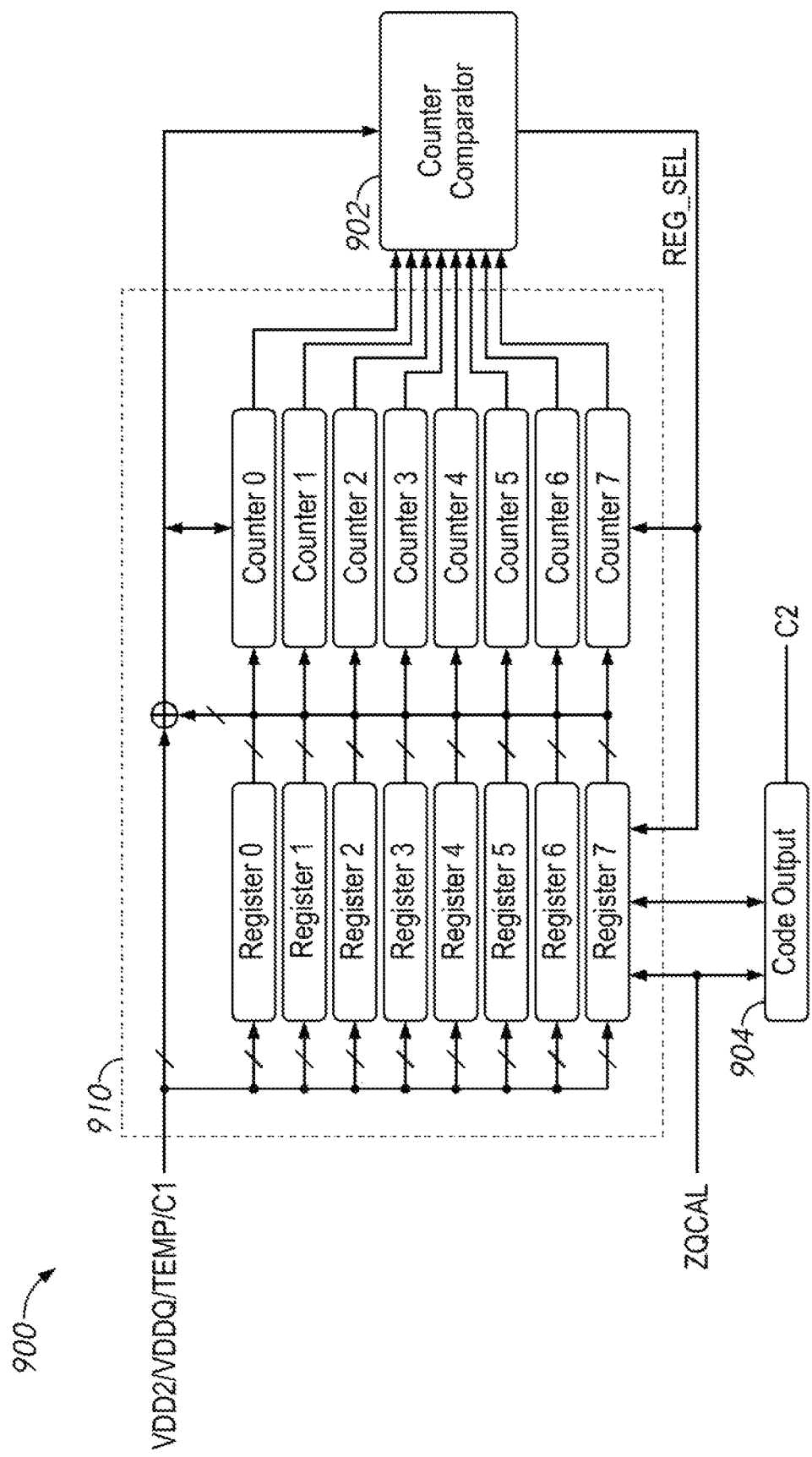
FIG. 9 is a diagram of an example register control circuit according to some examples described in the disclosure.

FIG. 9 is a diagram of an example register control circuit according to some examples described in the disclosure. In some examples, a register control circuit 900 may be implemented in the register control circuit 306 (in FIG. 3). The register control circuit 900 may be coupled to a register array 910. The register array 910 may be implemented in the register array 308 (in FIG. 3). For example, the register array 910 may include multiple registers, e.g., Register 0-7 (or other suitable number of registers). The register array 910 may also include multiple counters, e.g., Counter 0-1 (or other suitable number of counters). Each of the counters may be associated with a respective register in the multiple registers. Examples of configurations of registers and counters are described in the present disclosure with reference to FIG. 4A. Responsive to a ZQCAL command, the register control circuit 900 may retrieve a pre-stored calibration code (e.g., C2) from a matching register in the register array via a code output buffer 904. The retrieval of pre-stored calibration codes is previously described in detail with reference to FIGS. 3-6.

With further reference to FIG. 9, in some examples, the register control circuit 900 may include a counter comparator 902 configured to compare the values in each of the multiple counters in the register array 910 and determine a prioritization of the registers in terms of the counter values. In a non-limiting example, the counter comparator 902 may be configured to implement an update policy. For example, in storing a new calibration code in the register array, the counter comparator 902 may determine the frequently visited registers by comparing the values in the counters associated with the registers. The counter comparator 902 may subsequently determine to keep the register with a higher count. Conversely, the counter comparator 902 may determine to replace the register having a lower count with the new calibration code.

In some examples, the counter comparator 902 may provide a REG_SEL signal to the register array 910, where the REG_SEL signal indicates a pointer to a register/counter in the register array. In the above example, the REG_SEL indicates which register is selected to replace its content with the new calibration code. The register control circuit 900 may be configured to receive a calibration code (e.g., code C1) obtained from a ZQ calibration circuit (e.g., 40 in FIG. 1), and store the calibration code to the selected register indicated by the REG_SEL signal. Subsequently, the voltage/temperature conditions in the selected register may also be replaced by the current voltage/temperature conditions of the semiconductor device, e.g., VDD2/VDDQ/TEMP. Additionally, the counter associated with the selected register may be reset (e.g., to a value zero or one).

Returning to FIG. 3, the register array 308 and temperature comparator 304 may be implemented in a CAM. In some examples, the voltage comparator 302 may also be implemented in the CAM. For example, the registers in the CAM may be searched by the voltage/temperature values in the voltage and temperature fields. Once a register is found to match the voltage/temperature values being searched, the calibration code stored in the found register may be output. The use of a CAM for storing the calibration codes may reduce circuitry complexity in the register control circuit or the voltage comparator or temperature comparator as some search/compare functions may be built-in in the CAM. As such, variations of the embodiment described in FIG. 3 may be possible without departing the scope of the present disclosure. For example, in an example implementation, the voltage and temperature fields in each register are searched together, where each register in the register array contains a combination of voltage and temperature codes, e.g., 420 shown in FIG. 4B.

In a non-limiting example, with reference to FIG. 4B, the voltage stored in the voltage field may include the 3-digit voltage code indicating of the voltage variation zone. The temperature in the temperature field may include the temperature value obtained from the temperature sensor (e.g., 43 in FIG. 1) of the semiconductor device. When a combination of the voltage and temperature conditions of the semiconductor device is matched to a pre-stored combination of voltage/temperature in the CAM register array, then the DOZQCAL becomes inactive, and the associated ZQCODE in the matching register is retrieved as C2 and provided to the IO circuit as ZQCODE1. When a combination of the voltage and temperature conditions of the semiconductor device is not matched to any register in the register array, then the DOZQCAL becomes active, and a ZQ calibration will be subsequently performed. In another example implementation, the voltage field or temperature field in each register is searched. In some configurations, separate CAMs may be used for voltage comparator and temperature comparator.

Figure 7:
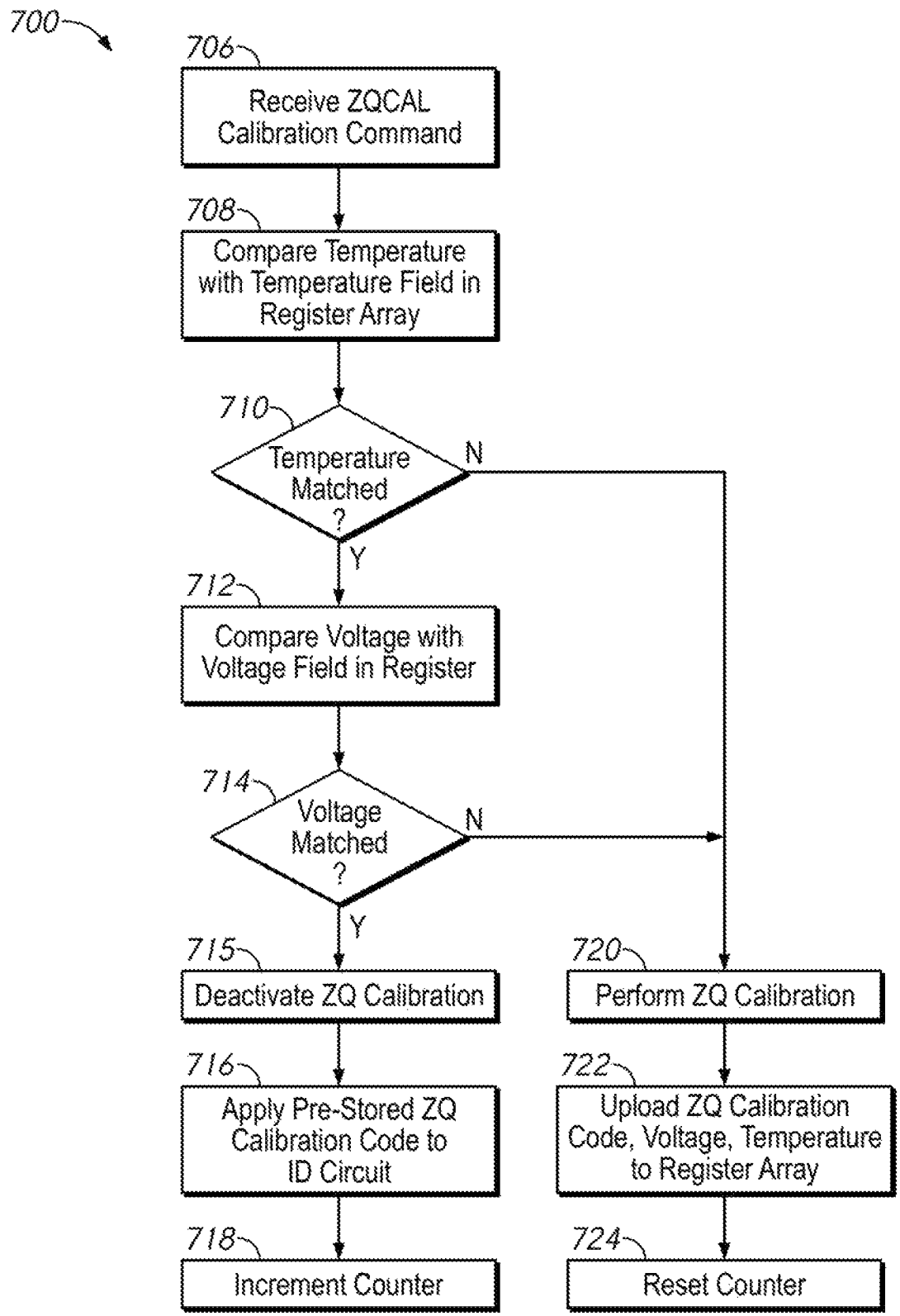
FIG. 7 is a flow diagram of performing a ZQ calibration operation according to some examples described in the disclosure.

FIG. 7 is a flow diagram of an example process of performing a ZQ calibration operation according to some examples described in the disclosure. In some examples, the example process 700 in FIG. 7 may be implemented in various configurations, such as in the ZQ calibration control circuit 300 in FIG. 3. The process 700 for performing a ZQ calibration operation may include receiving a ZQ calibration command, e.g., ZQCAL (in FIGS. 1 and 3) at operation 706. The ZQCAL command may be provided by a command decoder circuit (e.g., 34 in FIG. 1). Responsive to receiving the ZQCAL command, the process 700 may compare a temperature signal with temperature conditions in a register array (e.g., 308 in FIG. 3) at operation 708. The temperature signal may indicate the operating temperature of the semiconductor device. A temperature field in a register may contain a temperature condition, such as a temperature value. In some examples, operation 706-710 may be implemented in a temperature comparator, such as the temperature comparator 304 in FIG. 3, and performed in a similar manner as described in the embodiments in FIG. 3.

If the temperature signal matches a temperature condition pre-stored in the register array at operation 710, then the process 700 may compare the power supply voltage of the semiconductor device with voltage condition in the register that contains the matched temperature condition at operation 712. A voltage condition may contain a voltage code, for example, as described in FIG. 5A. If the voltage of the power supply does not match the voltage field in the register at operation 714, then the proem 700 may proceed with ZQ calibration at operation 720. If the power supply voltage matches the voltage field of the register at operation 714, the proem 700 may determine to skip a ZQ calibration operation and, instead, apply a pre-stored calibration code to the IO circuit. In skipping the ZQ calibration operation, the process 700 may deactivate ZQ calibration at operation 715. In a non-limiting example, operation 715 may include providing an inactive DOZQCAL signal to the ZQ calibration circuit (e.g., 40 in FIG. 1) to deactivate the ZQ calibration circuit. The operation 712-714 may be implemented in a voltage comparator, such as the voltage comparator 302 in FIG. 3, and performed in a similar manner as described in the embodiments of FIG. 3.

With continued reference to FIG. 7, the process 700 may further apply a pre-stored ZQ calibration code in the register to the IO circuit at operation 716. The operation 716 may be performed in a similar manner as described in various embodiments with reference to FIG. 3. For example, the operation 716 may retrieve from the register array 308 the pre-stored ZQ calibration code associated with the matched voltage/temperature condition via control of the register control circuit 306 (in FIG. 3). The operation 716 may further control a switching circuit (e.g., switching circuit 310 in FIG. 3) to provide the retrieved pre-stored ZQ calibration code to the IO circuit, responsive to a control signal, such as an inactive DOZQCAL signal.

Concurrent with the retrieval of the pre-stored ZQ calibration code, the process 700 may further increment the counter associated with the retrieved ZQ calibration code at operation 718. In some examples, the counter is implemented in the register array 308 (in FIG. 3) associated with the register storing the retrieved ZQ calibration code. The count in the counter represents the frequency of the retrieved ZQ calibration code being retrieved. The count in the counter also represents the frequency of the corresponding voltage/temperature condition being matched, for example, in operations 708 and 712.

With further reference to FIG. 7, when there is no temperature match at operation 710 or there is no voltage match at operation 714, the process 700 may provide an active DOZQCAL signal to the ZQ calibration circuit (e.g., 40 in FIG. 1). At operation 720, the process may perform the ZQ calibration responsive to the active DOZQCAL signal. This is performed in a similar manner as described in embodiments in FIG. 3. The operation 720 may further provide the ZQ calibration code from the ZQ calibration operation to the IO circuit via a switching circuit. For example, with reference to FIG. 3, the switching circuit 310 may be controlled to provide the calibration code ZQCODE from the ZQ calibration circuit to the IO circuit, responsive to the active DOZQCAL signal.

In some examples, the process 700 may further upload the ZQ calibration code provided by the ZQ calibration circuit to the register array at operation 722. This operation may be performed in a similar manner as described in various embodiments with reference to FIG. 3. For example, an update policy may be used to select a register to be updated, replace the content of a selected register with the new calibration code via control of a register control circuit (e.g., 306 in FIG. 3). The content of the selected register may also be updated by the voltage/temperature condition at the time the ZQ calibration operation was performed (e.g., operation 720). Similar to the embodiments in FIG. 3, the counter associated with the register being updated may also be reset at operation 724.

Returning to FIG. 4A, the ZQ calibration codes may be initially stored in the register array 400 and updated according to various embodiments with reference to FIGS. 1-7. In some examples, an initial calibration table including multiple voltage/temperature conditions and associated calibration codes may be obtained from a back-end test. The calibration table may be burned into a fuse array of the semiconductor device. When the semiconductor device is powered up, the calibration table in the fuse array may be loaded into the register array (e.g., 308 in FIG. 3), such as a CAM. In a non-limiting examples, the initial calibration table may include several voltage/temperature conditions that happen most frequently during the back-end test of the semiconductor device, along with the ZQ calibration code for each voltage/temperature condition. The size of the calibration table may be any suitable number of registers and associated counters, for example, 7, 8 or other numbers of registers and associated counters.

In some examples, in a back-end test, a test process may set the power supply of the semiconductor VDDQ to a normal high voltage, such as 5 volts. The test process may change the temperature of the semiconductor device and swing the pull-up and/or pull-down code by performing multiple ZQ calibration operation to generate the initial calibration codes. In some examples, the calibration codes may include the pull-up and/or pull-down codes. In a non-limiting example, in generating the pull-down calibration codes, the test process may start with a higher temperature, such as 125° C., and decrease the temperature by an amount, such as 25° C. at every run. At each temperature, the maximum swing range may be set to the pull-down code of the previous temperature.

In some examples, at the initial temperature 125° C., the test process may increase the pull-down calibration code from zero up to when the Ron is close to 240 Ohm, where Ron=VDDQ/Ion (Ion is the current flowing through the resistor RZQ). At the next temperature, e.g., 100° C., the pull-down calibration code may be adjusted from the calibration code obtained from the previous test at 125° C. and decrease until Ron is close to 240 Ohm again. The calibration code for the next temperature, e.g., 75° C. may start from the calibration code obtained from the previous test, so on and so forth. In this manner, because a lower temperature decreases the resistance, the range of calibration code may become narrower and narrower when the temperature decreases. This would achieve a faster tuning to obtain the initial calibration codes. Whereas a process for obtaining the initial calibration table is described, it is appreciated that other processes may also be available. Likewise, similar process may be performed to obtain initial voltages.

As shown in various embodiments described in FIG. 1-7, responsive to a ZQCAL command, the ZQ calibration needs not be performed all time. The voltage/temperature conditions (indicating the voltage and/or temperature conditions of the semiconductor device) and associated calibration codes of multiple instances of ZQ calibrations are pre-stored in a register array. When a voltage/temperature condition at the time when a previous ZQ calibration was performed occurs again, the corresponding pie-stored calibration code is retrieved from the register array and provided to the IO circuit. Consequently, ZQ calibration can be skipped. This reduces the power loss due to the high power required off of a ZQ calibration operation and thus improve the performance of the semiconductor device. Further, a pre-stored calibration code may be instantly retrieved and applied to the IO circuit, thus the impedance of the IO circuit can be accurately adjusted.

Figure 8:
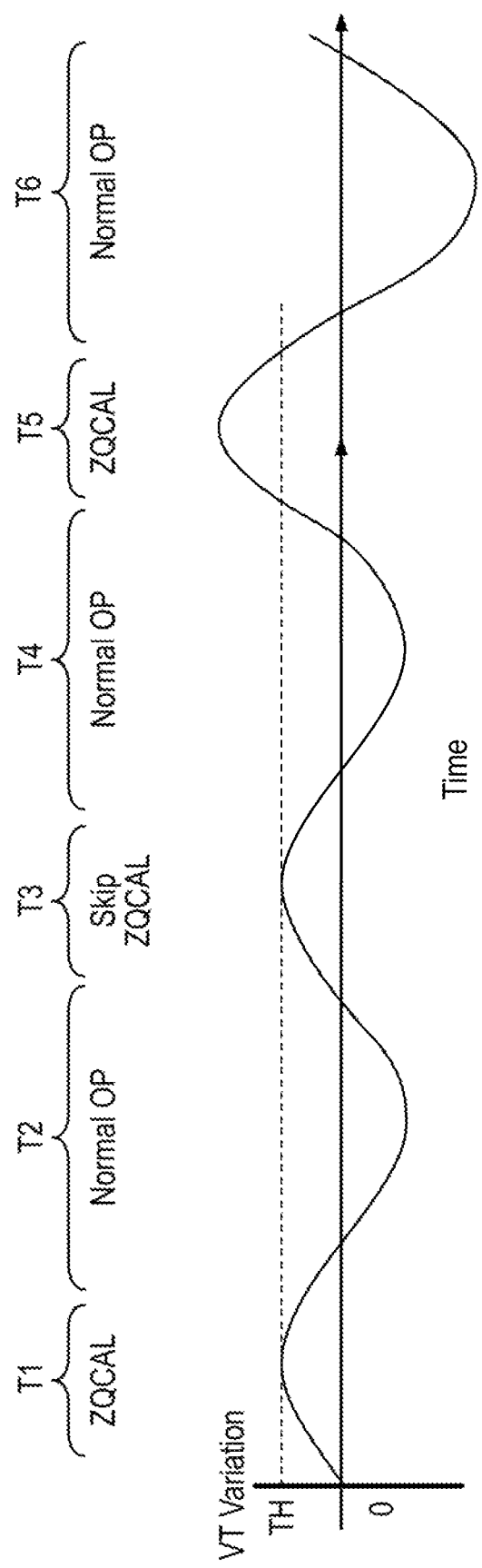
FIG. 8 is a diagram showing the status of periodic ZQ calibrations according to some examples described in the disclosure.

FIG. 8 is a diagram showing the status of periodic ZQ calibrations according to some examples described in the disclosure. Various voltage/temperature conditions occur during the operation of an example semiconductor device, such as the semiconductor device 10 shown in FIG. 1. The example semiconductor device may include a ZQ calibration circuit that operates via control of a ZQ calibration control circuit described in various embodiments with reference to FIGS. 1-7. In a non-limiting example, during the time period T1, the voltage/temperature (VT) variation reaches a threshold TH, and a ZQ calibration is performed. Here, the VT variation may refer to a voltage variation relative to a reference voltage, a temperature variation relative to a reference temperature, or a combination of voltage variation and temperature variation. The threshold TH may refer to a combination of voltage variation threshold and temperature variation threshold. Alternatively, the threshold TH may refer to a voltage variation threshold or a temperature variation threshold. During the time period T1, a ZQ calibration code is provided by the ZQ calibration circuit and pre-stored in the register array (e.g., 308 in FIG. 3), along with associated voltage/temperature condition.

With further reference to FIG. 8, at the time periods T2, T4, T6, the VT variation is below the threshold TH and the semiconductor device is in normal operation (without ZQ calibration). During the time period T3, the VT variation reaches the threshold TH again. However, this time, the voltage/temperature condition matches a pre-stored voltage/temperature condition from a previous calibration. As such, the ZQ calibration is skipped. Subsequently, the pre-stored ZQ calibration code associated wife the matched voltage/temperature is retrieved and applied to the IO circuit (e.g., 17 in FIG. 1) of the semiconductor device. During the time period T5, the VT variation is above the threshold, however, it does not match any of the pre-stored voltage/temperature condition from previous calibrations. ZQ calibration is subsequently performed, and the register array is updated under an update policy so that a register in the register array is selected to be updated with the calibration code provided in the ZQ calibration.

From the foregoing it will be appreciated that, although specific embodiments of the disclosure have been described herein for purposes of illustration, various modifications may be made without deviating from the spirit and scope of the disclosure. For example, the register array may be a CAM or other types of memory. The update policy for updating the register array may also use other rules, such as first-in-first-out, first-in-last-out or other policies. Accordingly, the scope of the disclosure should not be limited any of the specific embodiments described herein.

Certain details are set forth below to provide a sufficient understanding of examples of various embodiments of the disclosure. However, it is appreciated that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

What is claimed is:

1. An apparatus comprising:
   an input/output (IO) circuit;
   a ZQ calibration circuit configured to:
      perform ZQ calibration responsive to an active ZQ calibration control signal to provide a ZQ calibration code; and
      not perform ZQ calibration responsive to an inactive ZQ calibration control signal; and
   a ZQ calibration control circuit coupled to the IO circuit and the ZQ calibration circuit, and configured to, responsive to a ZQ calibration signal:
      provide the inactive ZQ calibration control signal when voltage/temperature condition matches a voltage/temperature condition stored in a register array; or
      provide the active ZQ calibration control signal when the voltage/temperature condition does not match any voltage/temperature condition stored in the register array.

2. The apparatus of claim 1, wherein the ZQ calibration control circuit is further configured to, when the voltage/temperature condition matches the voltage/temperature condition in the register array:
   retrieve a ZQ calibration code associated with the matching voltage/temperature condition in the register array; and
   provide the retrieved ZQ calibration code to the IO circuit.

3. The apparatus of claim 1, wherein the ZQ calibration control circuit comprises a temperature comparator configured to receive a temperature signal from a temperature sensor and provide the active ZQ calibration control signal if a temperature value in the temperature signal does not match any temperature condition in the register array.

4. The apparatus of claim 3, wherein the ZQ calibration control circuit further comprises a voltage comparator coupled to the temperature comparator, and wherein the temperature comparator is further configured to, when the temperature value in the temperature signal matches one or more temperature conditions stored in the register array, activate the voltage comparator.

5. The apparatus of claim 4, wherein the voltage comparator comprises:
   a plurality of amplifiers configured to receive a voltage signal and provide a voltage code of the voltage signal; and
   a voltage code comparator coupled to the plurality of amplifiers and configured to:
      provide the active ZQ calibration control signal if the voltage code of the voltage signal does not match any voltage condition associated with the one or more matching temperature conditions in the register array; otherwise
      provide the inactive ZQ calibration control signal;
   wherein voltage conditions in the register array are also represented by respective voltage codes.

6. The apparatus of claim 5, wherein each of the plurality of amplifiers is coupled to a voltage line to receive the voltage signal and a reference voltage line to receive a respective variation of a reference voltage, wherein output of the plurality of amplifiers form the voltage code of the voltage signal.

7. The apparatus of claim 5, wherein the ZQ calibration control circuit further comprises a switching circuit coupled to the voltage comparator, the temperature comparator and the IO circuit, and is configured to:
   responsive to the active ZQ calibration control signal, provide the ZQ calibration code provided by the ZQ calibration circuit to the IO circuit; and
   responsive to the inactive ZQ calibration control signal, provide a ZQ calibration code stored in the register array to the IO circuit.

8. The apparatus of claim 1, wherein the register array comprises a plurality of registers, each containing a respective voltage/temperature condition and associated ZQ calibration code from previous ZQ calibrations.

9. The apparatus of claim 8, wherein the register array further comprises a plurality of counters each associated with a respective register of the plurality of registers, wherein:
   when the voltage/temperature condition matches the voltage/temperature condition in the register array, a counter associated with register containing the matching voltage/temperature condition is configured to increment.

10. The apparatus of claim 9, wherein the ZQ calibration control circuit is further configured to, when the voltage/temperature condition does not match any voltage/temperature condition in the register array:
   select a register in the register array; and
   update the selected register with the ZQ calibration code provided by the ZQ calibration circuit and the voltage/temperature condition.

11. A method comprising, responsive to a ZQ calibration signal:
   performing a ZQ calibration to provide a ZQ calibration code when voltage/temperature condition of a semiconductor device does not match any pre-stored voltage/temperature condition in a register array; and
   not performing the ZQ calibration when the voltage/temperature condition of the semiconductor device matches a pre-stored voltage/temperature condition in the register array.

12. The method of claim 11 further comprising, when the voltage/temperature condition matches the pre-stored voltage/temperature condition in the register array:
   retrieving a pre-stored ZQ calibration code associated with the pre-stored voltage/temperature condition in the register array; and
   providing the retrieved pre-stored ZQ calibration code to an input/output (IO) circuit of the semiconductor device.

13. The method of claim 11 further comprising determining that the voltage/temperature condition of the semiconductor device does not match any pre-stored voltage/temperature condition in the register array if a temperature value in a temperature signal from a temperature sensor does not match any pre-stored temperature condition in the register array.

14. The method of claim 13 further comprising determining that voltage/temperature condition of the semiconductor device matches the pre-stored voltage/temperature condition in the register array if the temperate value in the temperature signal from the temperature sensor matches one or more pre-stored temperature conditions in the register array and a voltage condition of the semiconductor device also matches a pre-stored voltage condition in the register array, wherein the pre-stored voltage condition is associated with a pre-stored temperature condition of the one or more of the matching pre-stored temperature conditions.

15. The method of claim 14, wherein determining that the voltage signal matches the pre-stored voltage condition in the register array comprises:
   converting the voltage signal to a voltage code; and
   determining that a difference between the converted voltage code and the pre-stored voltage condition in the register array is below a zone threshold, wherein the pre-stored voltage condition is represented in voltage code.

16. An apparatus comprising:
   an input/output (IO) circuit; and
   a ZQ calibration control circuit coupled to the IO circuit and configured to, responsive to a ZQ calibration signal:
      when voltage/temperature condition does not match any voltage/temperature condition in a register array:
         activate a ZQ calibration circuit to provide a ZQ calibration code to the IO circuit; and
      when the voltage/temperature condition matches a voltage/temperature condition in the register array:
         retrieve a ZQ calibration code from the register array associated with the matching voltage/temperature condition; and
         provide the retrieved ZQ calibration code to the IO circuit.

17. The apparatus of claim 16, wherein the ZQ calibration control circuit comprises:
   a temperature comparator configured to receive a temperature signal from a temperature sensor; and
   a voltage comparator configured to receive a voltage signal indicating a power supply voltage;
   wherein the temperature comparator and the voltage comparator are configured to:

determine that the voltage/temperature condition matches the voltage/temperature condition in the register array if a temperature value in the temperature signal matches a temperature condition in the register array and a voltage value in the voltage signal also matches a voltage condition in the register array associated with the matching temperature condition; and determine that the voltage/temperature condition does not match any voltage/temperature condition in the register array, if the temperature in the temperature signal and the voltage value in the voltage signal do not together match any voltage/temperature condition in the register array.

18. The apparatus of claim 17, wherein the ZQ calibration control circuit further comprises a switching circuit coupled to the voltage comparator and the temperature comparator, and is configured to:

when the voltage/temperature condition does not match the voltage/temperature condition in the register array, supply the ZQ calibration code provided by the ZQ calibration circuit to the IO circuit; and when the voltage/temperature condition does match any voltage/temperature condition in the register array, provide the retrieved ZQ calibration code to the IO circuit.

19. The apparatus of claim 18 further comprising a fuse array containing a plurality of voltage/temperature conditions and associated ZQ calibration codes, wherein the register array is uploaded with the plurality of voltage/temperature conditions and the associated ZQ calibration codes at a power-up.

20. The apparatus of claim 19, wherein the register array and the temperature comparator comprise at least a portion of a content-addressed memory (CAM).

* * * * *